US009153081B2

(12) United States Patent
Kato (10) Patent No.: US 9,153,081 B2
(45) Date of Patent: Oct. 6, 2015

(54) COUNTER APPARATUS (71) Applicant: DENSO CORPORATION, Kariya, Aichi-pref. (JP)

(72) Inventor: Hiromichi Kato, Kasugai (JP)

(73) Assignee: DENSO CORPORATION, Kariya (JP)

( * ) Notice: Subject to any disclaimer, the term of this patent is extended or adjusted under 35 U.S.C. 154(b) by 218 days.

(21) Appl. No.: 14/067,385

(22) Filed: Oct. 30, 2013

(65) Prior Publication Data
US 2014/0119489 A1    May 1, 2014

(30) Foreign Application Priority Data
Nov. 1, 2012   (JP) .................................. 2012-241929

(51) Int. Cl.
G07C 3/02    (2006.01)
G07C 5/10    (2006.01)
H03K 21/38   (2006.01)
B60W 50/00   (2006.01)
F02D 45/00   (2006.01)
G01P 3/42    (2006.01)

(52) U.S. Cl.
CPC ................. G07C 5/10 (2013.01); B60W 50/00 (2013.01); F02D 45/00 (2013.01); G01P 3/42 (2013.01); H03K 21/38 (2013.01); *G06F 2201/875* (2013.01)

(58) Field of Classification Search
None
See application file for complete search history.

(56) References Cited

U.S. PATENT DOCUMENTS

| 6,445,998 | B2 * | 9/2002 | Ando ............................ 701/114 |
| 7,027,913 | B2 | 4/2006 | Kobayashi et al. |
| 2001/0032049 | A1 * | 10/2001 | Ando ............................ 701/105 |
| 2003/0163247 | A1 * | 8/2003 | Kobayashi et al. ........... 701/114 |
| 2006/0206613 | A1 | 9/2006 | Narita |
| 2009/0063008 | A1 * | 3/2009 | Ishikawa et al. .............. 701/102 |
| 2009/0265079 | A1 * | 10/2009 | Kondo .......................... 701/103 |
| 2010/0018299 | A1 * | 1/2010 | Takeuchi .................... 73/114.26 |
| 2011/0035180 | A1 | 2/2011 | Jin |

FOREIGN PATENT DOCUMENTS

| JP | 05-071410 | 3/1993 |
| JP | 7-310587 | 11/1995 |
| JP | 10-213001 | 8/1998 |
| JP | 11-177590 | 7/1999 |
| JP | 2001-208564 | 8/2001 |
| JP | 2001-323836 | 11/2001 |
| JP | 2003-184637 | 7/2003 |
| JP | 2003-293843 | 10/2003 |
| JP | 2004-190662 | 7/2004 |

(Continued)

*Primary Examiner* — Tuan T Lam
(74) *Attorney, Agent, or Firm* — Nixon & Vanderhye PC (57) ABSTRACT Of a counter apparatus, a first microcomputer and a second microcomputer communicate with each other and receive a crank signal with pulses. The first microcomputer detects a first pulse count number at a detection time point and transmits it to the second microcomputer. The second microcomputer detects a second pulse count number at a determination time point, which is an allowable delay time period later from the detection time point. The allowable delay time period is expected to elapse from the detection time point to when the first pulse count number is received by the second microcomputer. The second pulse count number is compared with a determination value, which is the sum of (i) the first pulse count number and (ii) the largest integer not greater than the quotient of T2/T1, T1 being a pulse period of the crank signal, T2 being the allowable delay time period.

8 Claims, 6 Drawing Sheets

(56) References Cited

FOREIGN PATENT DOCUMENTS

| | | |
|---|---|---|
| JP | 2006-050878 | 2/2006 |
| JP | 2006-121784 | 5/2006 |
| JP | 2006-228091 | 8/2006 |
| JP | 2006-285977 | 10/2006 |
| JP | 2008-290666 | 12/2008 |
| JP | 2009-292168 | 12/2009 |
| JP | 2010-223065 | 10/2010 |
| JP | 2011-040886 | 2/2011 |
| JP | 2012-086631 | 5/2012 |

* cited by examiner

COUNTER APPARATUS

CROSS REFERENCE TO RELATED APPLICATION

The present application is based on Japanese Patent Application No. 2012-241929 filed on Nov. 1, 2012, the disclosure of which is incorporated herein by reference.

TECHNICAL FIELD

The present disclosure relates to a counter apparatus which includes a first microcomputer and a second microcomputer, which detect a pulse count number that is the number of pulses included in a crank signal.

BACKGROUND ART

Patent Literature 1: JP 2004-190662 A (U.S. Pat. No. 7,027,913 B2)

Patent Literature 1 proposes a vehicle control system including a sensor ECU, a transmission control module (TCM) ECU, and an ignition ECU, for example. In the vehicle control system, the information on crank angle is given from the sensor ECU to the TCM ECU; and the information on ignition timing is given from the TCM ECU to the ignition ECU. Then, the ignition ECU controls the igniter to synchronize with the crank angle.

Thus, the vehicle control system in Patent Literature 1 has a configuration to move the information from the sensor ECU to the TCM ECU, and then from the TCM ECU to the ignition ECU. In contrast, another configuration may be supposed which inputs a crank signal into each of two ECUs which control a target motor such as an engine. The crank signal is provided to have a signal level, which reciprocate between the high level and the low level each time a crank rotates by a predetermined angle. This configuration requires each ECU to synchronize with the crank signal, in order to control the motor with high precision.

To that end, a first ECU inputs a pulse count number to a second ECU. The pulse count number is obtained by counting the number of pulses included in the crank signal; the number of pulses is a pulse count that is the number of rising edges that occur when the signal level of the crank signal changes from the low level to the high level. Then, the second ECU determines whether the pulse count number inputted from the first ECU is equal to a pulse count number that is calculated internally by the second ECU. This enables a determination as to whether the first microcomputer and the second microcomputer synchronize with the crank signal. Such a configuration needs an input time period (i.e., a processing time period) up to the time when the pulse count number from the first ECU is inputted to the second ECU.

Thereby, a high velocity revolution of an engine may cause the processing time to become longer than a pulse period of the crank signal. Such a case determines that the first microcomputer and the second microcomputer do not synchronize with the crank signal even though the first microcomputer and the second microcomputer synchronize with the crank signal. Such a defect or mistake may be solvable by adopting a high-speed processing ECU or a high-speed communication network between ECUs. However, this needs additional costs.

SUMMARY

It is an object to provide a counter apparatus which suppresses an increase in cost.

To achieve the above object, according to an example of the present disclosure, a counter apparatus is provided as follows. The counter apparatus receives a crank signal with a signal level reciprocating between a high level and a low level to indicate a pulse that takes place each time a crank rotates by a predetermined angle. The counter apparatus includes a first microcomputer receiving the crank signal, and a second microcomputer receiving the crank signal. The second microcomputer is electrically connected with the first microcomputer. The first microcomputer detects a first pulse count number at a detection time point and transmits the first pulse count number to the second microcomputer. The first pulse count number is a number of pulses included in the crank signal received by the first microcomputer. The second microcomputer detects a second pulse count number at a determination time period. The second pulse count number is a number of pulses included in the crank signal received by the second microcomputer. The determination time point is an allowable delay time period later from the detection time point. The allowable delay time period is expected to elapse from the detection time point to when the first pulse count number is received by the second microcomputer. The second microcomputer determines whether the crank signal received by the first microcomputer is equal to the crank signal received by the second microcomputer by comparing the second pulse count number with a determination value that is the sum of (i) the first pulse count number and (ii) the largest integer not greater than the quotient of T2/T1, T1 being a pulse period of the crank signal, T2 being the allowable delay time period ranging from the detection time point to the determination time point.

The largest integer not greater than the quotient of (allowable delay time period T2/the pulse period T1) is represented as a gauss notation [T2/T1] or floor (T2/T1). In addition, when the first pulse count number is referred to as N1 and the second pulse count number is referred to as N2, the determination value is indicated as (N1+[T2/T1]). The second microcomputer compares (N1+[T2/T1]) with N2; thereby, the second microcomputer determines whether the crank signal received by the first microcomputer is equal to the crank signal received by the second microcomputer, i.e., whether the first microcomputer and the second microcomputer synchronize with the crank signal.

When the pulse period T1 is longer than the allowable delay time period T2 so that a delay to differentiate the second pulse count number N2 from the first pulse count number N1 does not occur in the communication in a range from the first microcomputer to the second microcomputer, [T2/T1] is 0 (zero). Therefore, the determination value becomes equal to N1. In this case, the second microcomputer determines that the determination value being equal to N1 is equal to the second pulse count number N2, and determines that the first microcomputer and the second microcomputer synchronize with the crank signal.

In contrast, when the pulse period T1 is shorter than the allowable delay time T2 so that a delay to differentiate the second pulse count number N2 from the first pulse count number N1 occurs in the communication from the first microcomputer to the second microcomputer, [T2/T1] is an integer equal to or greater than 1 (one). The pulse count number corresponding to the pulse period T1; thus, the communication delay is indicated by the allowable delay time period T2. Therefore, if the delay is converted into a pulse count number, the pulse count number is represented by an integer part of T2/T1, which is mathematically expressed by [T2/T1]. Therefore, the determination value which is obtained by adding [T2/T1] to the first pulse count number N1 becomes equal to the second pulse count number N2. That is, there is occurring a case where the delay to cause a difference between the first pulse count number N1 and the second pulse count number N2 in the communication from the first microcomputer to the second microcomputer. Even in such a case, the second microcomputer can determine that the determination value (N1+[T2/T1]) is equal to the second pulse count number N2, and thereby determines that the first microcomputer and the second microcomputer synchronize with the crank signal.

In other words, even when the crank rotates rapidly enough to make the pulse period T1 become shorter than the allowable delay time period T2, the first microcomputer and the second microcomputer are determined to be synchronizing with the crank signal. This permits a determination as to whether the first microcomputer and the second microcomputer synchronize with the crank signal, regardless of variation in the processing speed or transmission speed. Therefore, the first microcomputer and second microcomputer may be provided as a low-priced microcomputer with a slow processing speed; the communication between the first microcomputer and the second microcomputer may be provided not to require a high-speed communication network. This suppresses the counter apparatus from increasing costs.

Even when the communication delay (i.e., anomaly in communication), which cannot be admitted in the counter apparatus (100), occurs over a range between the first microcomputer and the second microcomputer, the above configuration performs the determination as to whether the first microcomputer and the second microcomputer synchronize with the crank signal.

Therefore, in order to determine an anomaly in communication, the following optional configuration may be provided, for instance. The second microcomputer calculates an actual processing time period that is experienced actually from the detection time point to when the first pulse count number is received by the second microcomputer. When the actual processing time period is not greater than the allowable delay time period, the determination value is compared with the second pulse count number so as to determine whether the crank signal received by the first microcomputer is equal to the crank signal received by the second microcomputer. In contrast, when the actual processing time period is greater than the allowable delay time period, it is determined whether an anomaly in communication occurs in between the first microcomputer the second microcomputer, i.e., in the first microcomputer, or in the second microcomputer, or between the first microcomputer and the second microcomputer. This optional configuration permits not only the determination as to whether the two microcomputers synchronize with the crank signal, but also the determination as to whether an anomaly in communication occurs.

As explained above, the second microcomputer determines whether the first microcomputer and the second microcomputer synchronize with the crank signal when the actual processing time period is not greater than the allowable delay time period. When the actual processing time period is not greater than the allowable delay time period, the first microcomputer is determined to be not anomalous and an anomaly is determined not to occur in communication. Thus, the determination value is expected to be normal. However, when the determination value is nonetheless not equal to the second pulse count number, the second microcomputer is expected to be anomalous.

Thus, another optional configuration may be provided as follows, for instance. That is, when the determination value is nonetheless not equal to the second pulse count number, the second pulse count number is determined to be anomalous so that the second pulse count number is amended to be equal to the determination value. Thereby, the second pulse count number is permitted to return to a normal state.

BRIEF DESCRIPTION OF THE DRAWINGS

The above and other objects, features, and advantages of the present disclosure will become more apparent from the following detailed description made with reference to the accompanying drawings. In the drawings.

DETAILED DESCRIPTION

Figure 1:
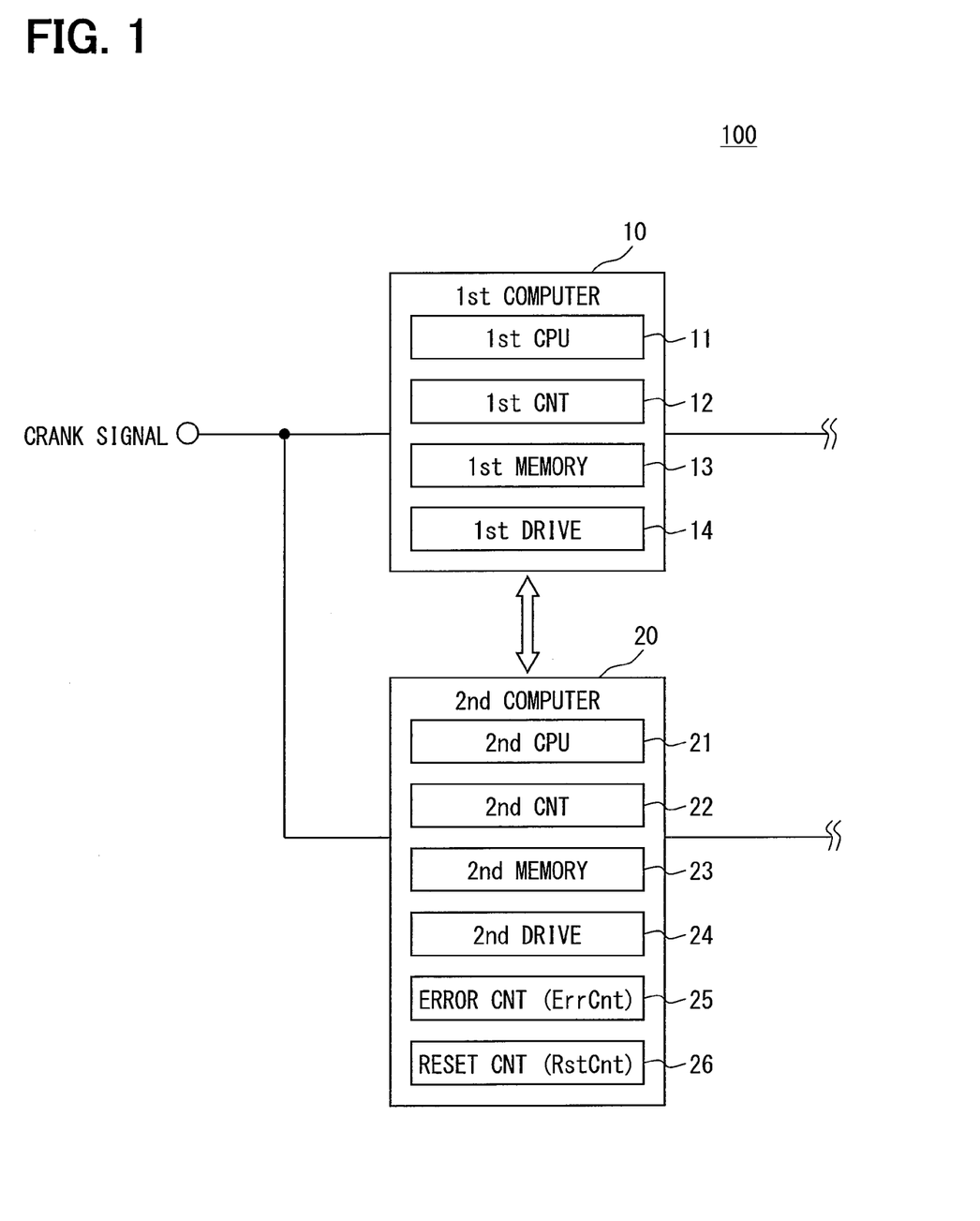
FIG. 1 is a block diagram illustrating a schematic configuration of a counter apparatus according to an embodiment of the present disclosure.

The following will explain a counter apparatus 100 according to an embodiment of the present disclosure with reference to FIGS. 1 to 7. With reference to FIG. 1, the counter apparatus 100 mainly includes a first microcomputer 10 and a second microcomputer 20. The microcomputers 10 and 20 are electrically connected with each other and receive a crank signal. The crank signal has a signal level that changes between a high (Hi) level and a low (Lo) level alternately each time a crank rotates by a predetermined angle. To be specific, with reference to FIG. 2, each time the crank rotates by a predetermined angle, the crank signal, which is inputted to the first microcomputer 10 and the second microcomputer 20, exhibits a reciprocal level change first from the Lo level to the Hi level and then from the Hi level to the Lo level.

The first microcomputer 10 performs an injection/ignition control; the second microcomputer 20 detects a pre-ignition, which is ignition of fuel in an internal-combustion engine earlier in the cycle than is compatible with proper operation. The microcomputers 10 and 20 synchronize with the crank signal, in order to perform an injection/ignition control with a high precision. As mentioned later, the synchronization with the crank signal is determined based on a first pulse count number N1 detected by the first microcomputer 10, a second pulse count number N2 detected by the second microcomputer 20, a pulse period T1 of the crank signal, and an allowable delay time period T2. Determining such synchronization with the crank signal is a featured configuration of the counter apparatus 100 according to the embodiment of the present disclosure. Such a featured configuration will be explained below.

With reference to FIG. 1, the first microcomputer 10 mainly includes the following: a first CPU 11; a first counter 12 which counts a rising edge of a pulse included in the crank signal when the rising edge is detected; a first memory 13 which stores data; and a first communication driver 14 which communicates with the second microcomputer 20. Similarly, the second microcomputer 20 mainly includes the following: a second CPU 21; a second counter 22 which counts a rising edge of a pulse included in the crank signal when the rising edge is detected; a second memory 23 which stores data; and a second communication driver 24 which communicates with the first microcomputer 10. In addition to the second counter 22, the second microcomputer 20 further includes an error counter 25 (ErrCnt) and a reset counter 26 (RstCnt), which will be explained later.

Figure 2:
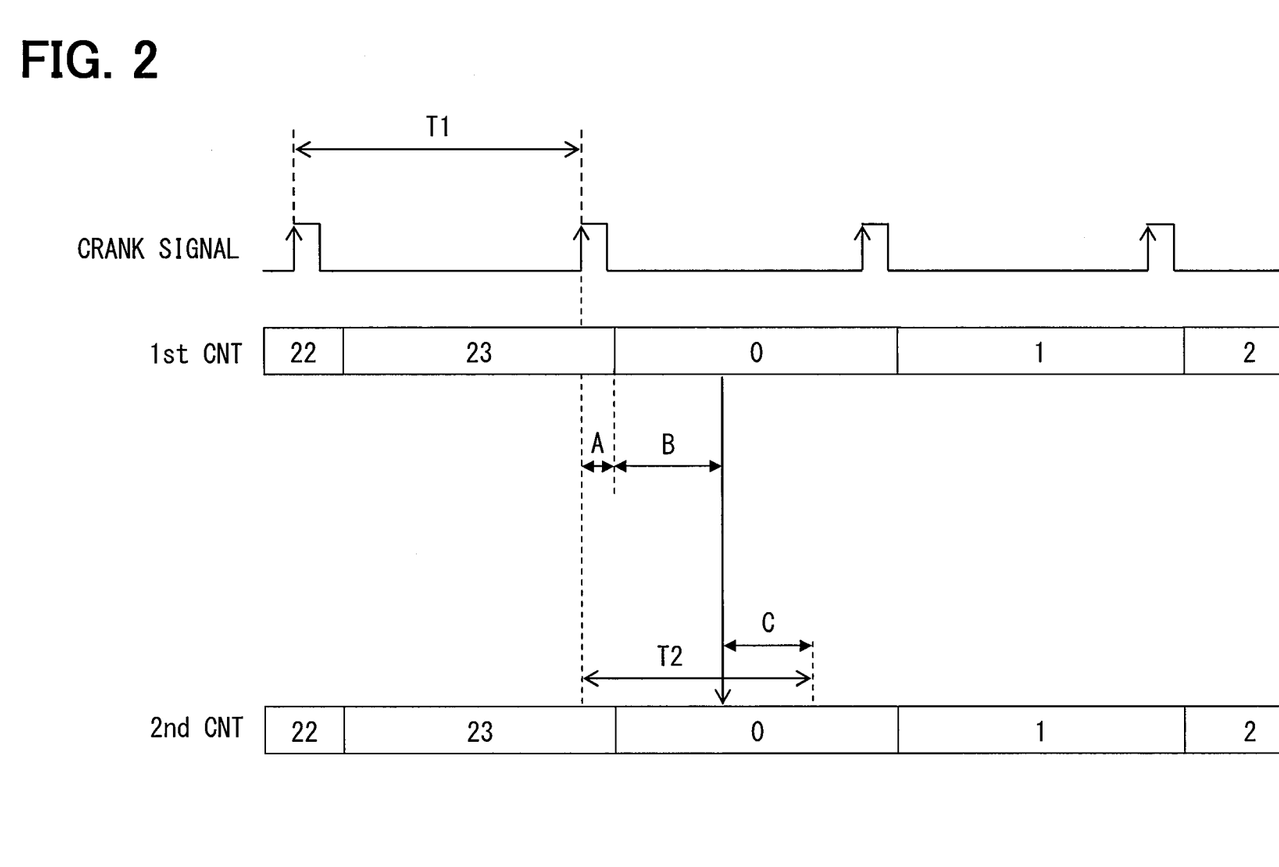
FIG. 2 is a diagram for explaining a crank signal, a first pulse count number, and a second pulse count number in cases where a pulse period is longer than an allowable delay time period.
Figure 3:
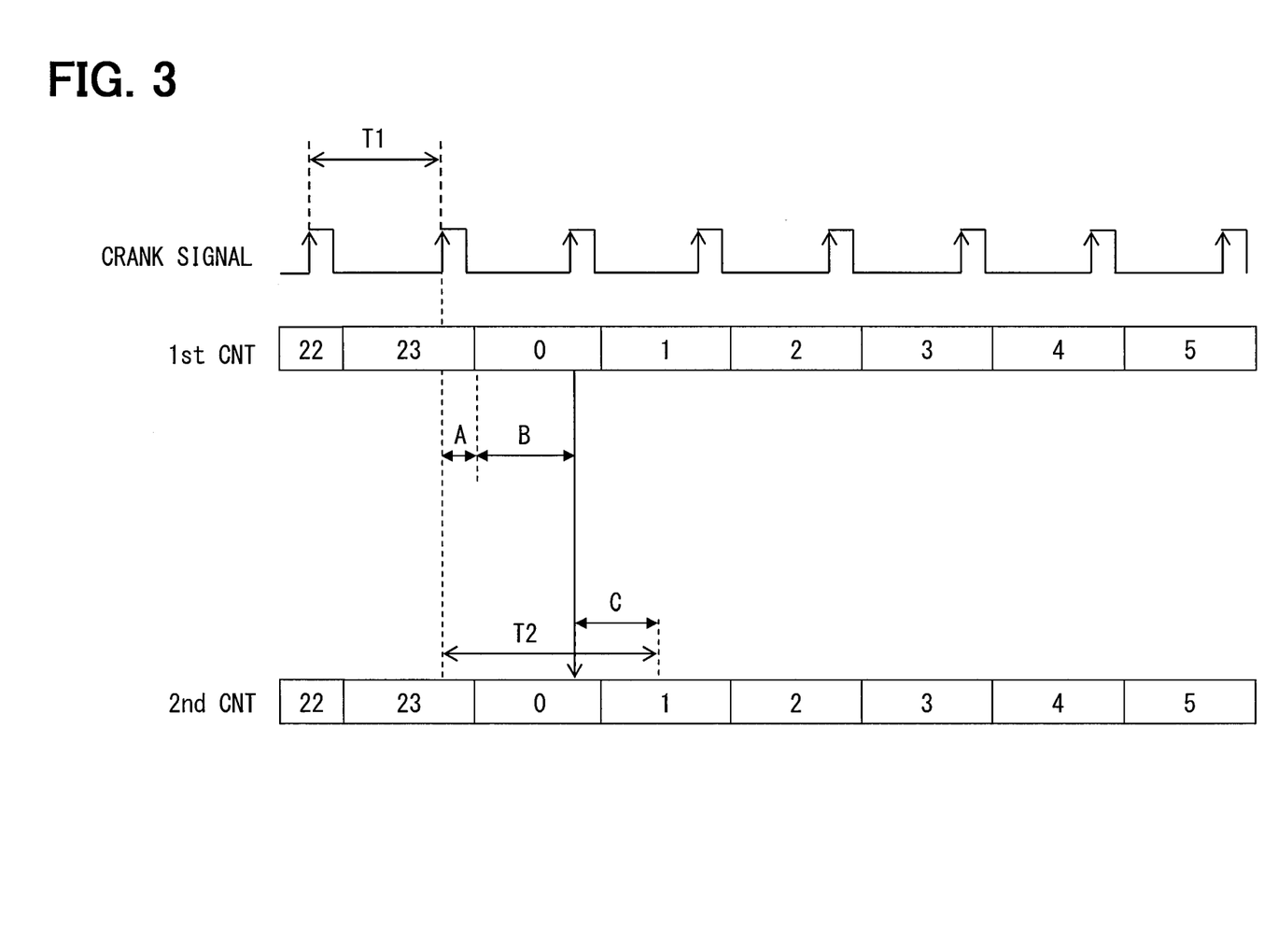
FIG. 3 is a diagram for explaining a crank signal, a first pulse count number, and a second pulse count number in cases where a pulse period is shorter than an allowable delay time period.
Figure 4:
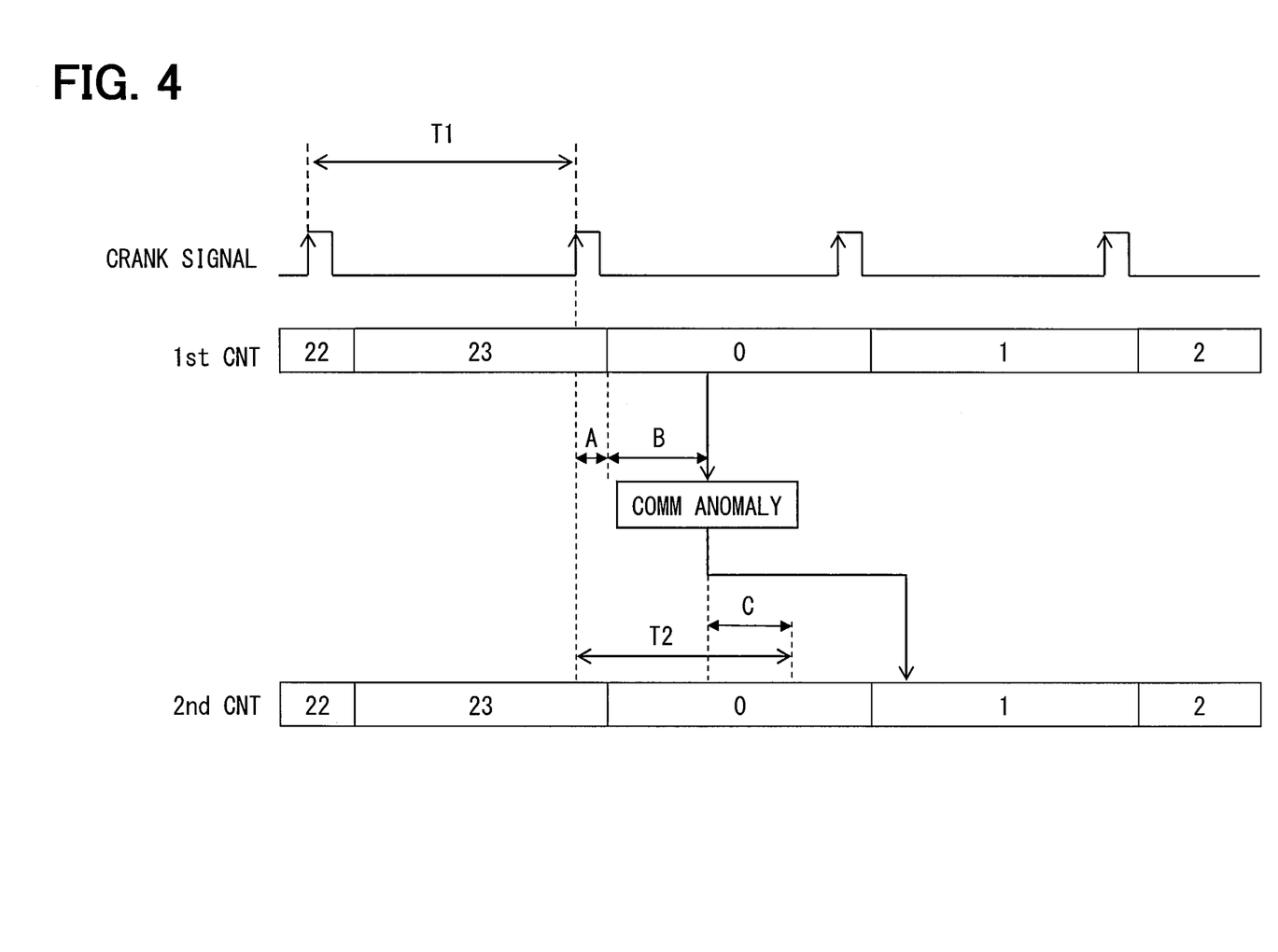
FIG. 4 is a diagram for explaining a crank signal, a first pulse count number, and a second pulse count number in cases where a communication anomaly occurs.

The crank is provided to have gear teeth with identical intervals. With reference to FIGS. 2 to 4, when the crank rotates at a constant velocity, the crank signal is inputted to the microcomputers 10 and 20 (i.e., received by the microcomputers 10 and 20) such that intervals of rising edges are constant or identical to each other. Therefore, a pulse period T1 of the crank signal, which corresponds to an interval of rising edges, is naturally constant or identical. However, there is a case that the crank lacks or misses a gear tooth. In such a case, the missing gear tooth causes a single input interval of rising edges inputted into the microcomputers 10 and 20 to be longer than the pulse period T1. The microcomputers 10 and 20 are provided to compare the length of this input interval with the pulse period T1 that is detected previously, thereby detecting the missing gear tooth. When the missing gear tooth is detected, the counters 12 and 22 clear the respective pulse count numbers (i.e., counted numbers) and then re-start to count a rising edge. In the present embodiment, the counters 12 and 22 count repeatedly the rising edges from 0 (zero) to 23.

Figure 5:
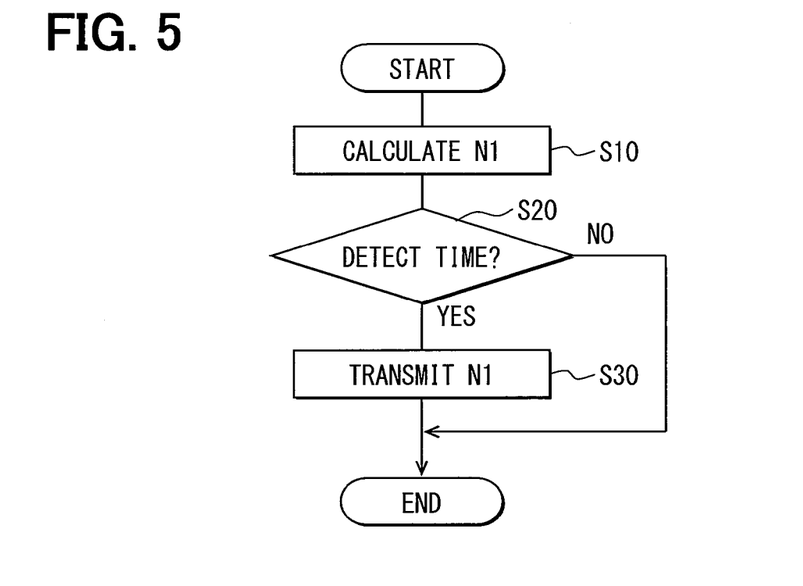
FIG. 5 is a flowchart diagram illustrating a process for a crank signal by a first microcomputer.

The following explains processes by the microcomputers 10 and 20 with reference to FIGS. 2 to 7. It is further noted that a flowchart in the present application includes sections (also referred to as steps), which are represented, for instance, as S10. Further, each section can be divided into several sections while several sections can be combined into a single section. Furthermore, each of thus configured sections can be referred to as a module, device, or means and achieved not only (i) as a software section in combination with a hardware unit (e.g., computer), but also (ii) as a hardware section (e.g., integrated circuit, hard-wired logic circuit), including or not including a function of a related apparatus. Further, the hardware section may be inside of a microcomputer. With reference to FIG. 5, each time detecting a rising edge of the crank signal, the first microcomputer 10 calculates a first pulse count number N1 (S10). The time when detecting a missing gear tooth is regarded as a detection time point, i.e., the first microcomputer 10 determines that a detection time point comes when detecting a missing gear tooth. The first pulse count number N1 at the detection time point is transmitted to the second microcomputer 20 (S20, S30).

FIGS. 2 to 4 will explain example cases where the first pulse count number N1 which the first microcomputer 10 transmits to the second microcomputer 20 is 0 (zero); a calculating time period for which the first pulse count number is calculated is defined as a time period A. A transmission time period, which is required for the transmission of the first pulse count number N1 from the first microcomputer 10 to the second microcomputer 20, is defined as a time period B. The sum of the time period A and the time period B is equivalent to an expected processing time period that is a time period to be expected to elapse from when the detection time point comes to when the first pulse count number N1 is received by or inputted to the second microcomputer 20. This expected processing time period is a specified value which is predetermined based on a processing time period of the first microcomputer 10, and a communication speed (i.e., a transmission speed) between the first microcomputer 10 and the second microcomputer 20. It is noted that the first microcomputer 10 is provided to perform a re-transmission process to transmit a signal again when not receiving from the second microcomputer 20 a reply signal that includes an acknowledgment indicative of reception of the signal transmitted first from the first microcomputer 10.

Figure 6:
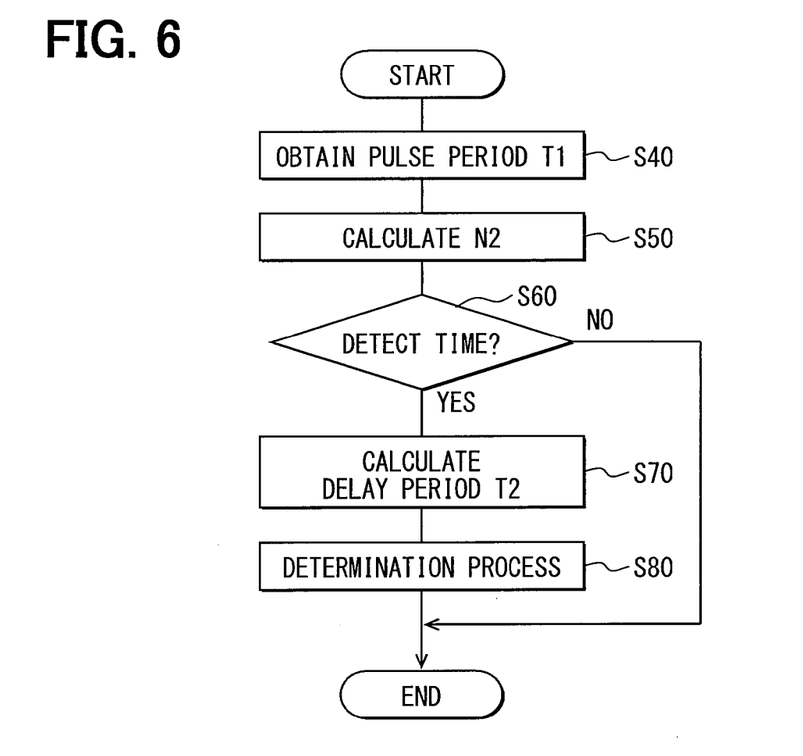
FIG. 6 is a flowchart diagram illustrating a process for a crank signal by a second microcomputer.

With reference to FIG. 6, each time detecting a rising edge of the crank signal, the second microcomputer 20 calculates a second pulse count number N2 (S50). When detecting a missing gear tooth, the second microcomputer 20 determines that a detection time point comes; then, the second microcomputer 20 calculates an allowable delay time period T2 which is a communication delay time period admitted in the counter apparatus 100 (S60, S70). The allowable delay time period T2 is a value obtained by adding a marginal time period C to the above-mentioned expected processing time period. The marginal time period C is a predetermined value like the expected processing time period (A+B). The second microcomputer 20 is provided to give a priority order to each of a plurality of processes of signals that are inputted. The marginal time period C is determined based on a standby time period produced by the priority order, a time period required for the re-transmission process by the first microcomputer 10, and a speed of the crank (a pulse period T1 of the crank signal) that is expected. The marginal time period C is illustrated in FIGS. 2 to 4. The allowable delay time period T2 is equivalent to the sum of the time periods A, B, and C (A+B+C). In this connection, the expected processing time period (A+B) and the marginal time period C are predetermined values; thus, the allowable delay time period T2 is also a predetermined value. The second microcomputer 20 then sets an occurrence of a determination event or starts a determination process, recited in FIG. 7, following the calculation of the allowable delay time period T2 (S80).

Further, as explained above, the second microcomputer 20 includes the error counter 25 (ErrCnt) and the reset counter 26 (RstCnt), in addition to the second counter 22. The second memory 23 includes storage areas corresponding to a determination suspension flag, a communication anomaly flag, and a counter anomaly flag, which will be explained later. It is noted that the flowchart of FIG. 7 indicates the error counter 25 as ErrCnt and the reset counter 26 as RstCnt. The determination process indicated in FIG. 7 is performed in parallel with the process indicated in FIG. 6.

Figure 7:
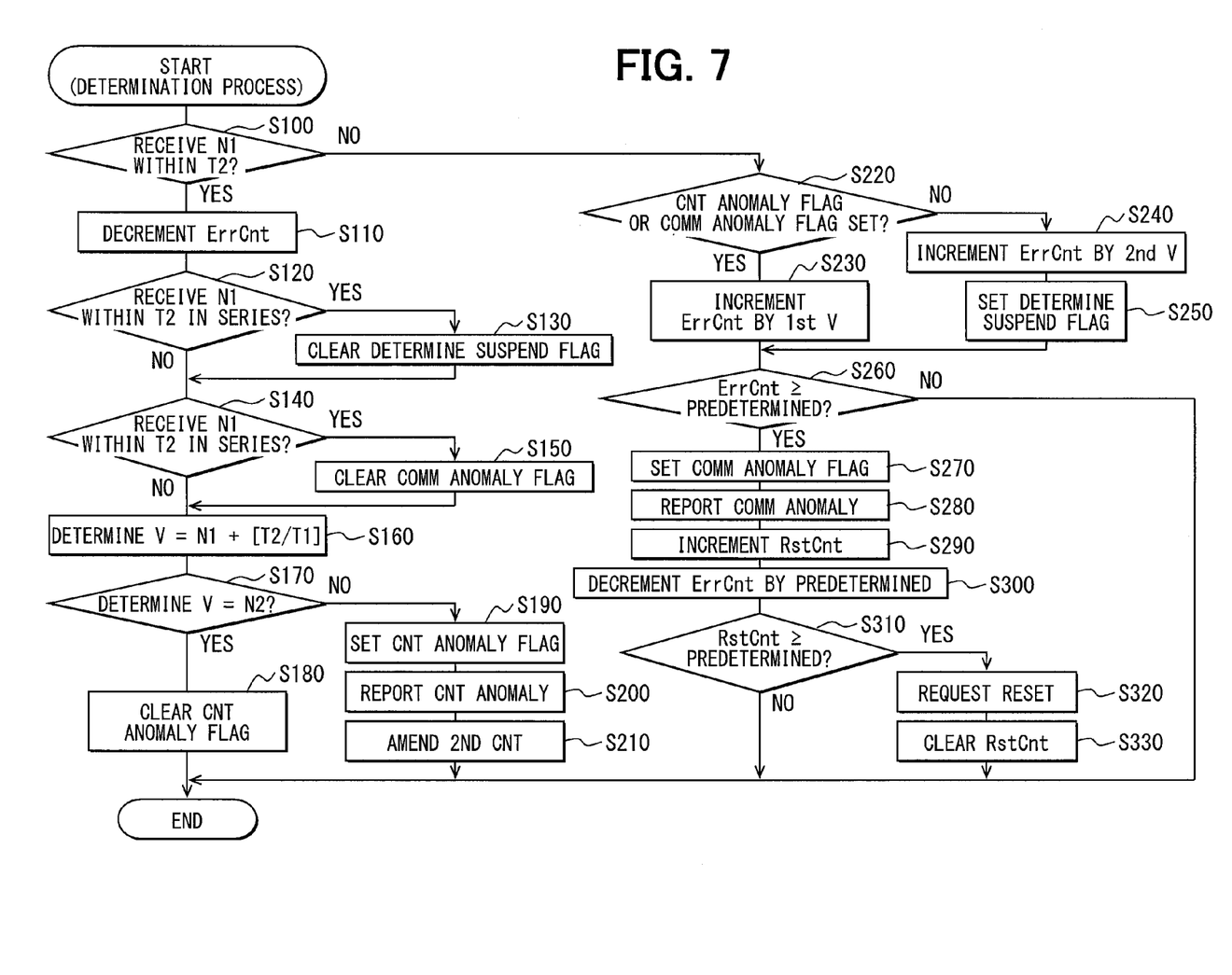
FIG. 7 is a flowchart diagram illustrating a determination process by a second microcomputer.

FIG. 7 illustrates a determination process. The second microcomputer 20 first determines whether the first pulse count number N1 is received within the allowable delay time period T2 (S100). That is, the second microcomputer 20 determines whether the actual processing time period, which elapsed or was experienced actually from when the detection time point comes to when the first pulse count number N1 is received by the second microcomputer 20 is shorter than the allowable delay time period T2. When determining that the actual processing time period is shorter than the allowable delay time period T2, the second microcomputer 20 determines that an excessive (i.e., unallowable) communication delay does not occur, thereby advancing to S110. When determining that the actual processing time period is longer than the allowable delay time period T2, the second microcomputer 20 determines that an excessive communication delay occurs, thereby advancing to S220. The following explains first S110 to S210 and then S220 to S330.

At S110, the second microcomputer 20 decrements the error counter 25, then advancing to S120. This error counter 25 is provided to be incremented when it is determined that a communication anomaly occurs. The error counter 25 is incremented at S230 and S240 which will be explained later. Therefore, when a communication anomaly does not occur, the value of the error counter 25 is constantly maintained zero.

At S120, the second microcomputer 20 determines whether normal successive receptions of the first pulse count number N1 continue (i.e., in series). One normal reception of the first pulse count number N1 signifies that the actual processing time in one-time reception of the first pulse count number N1 is within the allowable delay time period T2; if the normal receptions continue in series (i.e., the predetermined number of times the second microcomputer 20 receives the first pulse count numbers N1 is a first predetermined number more than one), the determination at S120 is affirmed as YES. It is noted that in the present embodiment, the first predetermined number of times of normal receptions is a first number not less than two (i.e., two times or more), for instance. When determining that the second microcomputer 20 receives the first pulse count numbers N1 in series, the second microcomputer 20 advances to S130. At S130, the second microcomputer 20 clears a determination suspension flag, then advancing to S140. The determination suspension flag is provided to suspend a determination as to whether the crank signal received by the first microcomputer 10 is equal to the crank signal received by the second microcomputer 20, which is processing at S170. When not determining that the second microcomputer 20 receives the first pulse count numbers N1 in series, the second microcomputer 20 advances directly to S140 while bypassing S130. The determination suspension flag is set (i.e., in an ON state) when it is determined that an anomaly in communication (i.e., a communication anomaly) occurs; the determination suspension flag is set at S250, which will be explained later. Therefore, when no anomaly in communication occurs, the determination suspension flag is constantly maintained to be reset (i.e., in an OFF state).

At S140, the second microcomputer 20 determines whether normal successive receptions of the first pulse count number N1 continue (i.e., in series), like at S100. One normal reception of the first pulse count number N1 signifies that the actual processing time in one-time reception of the first pulse count number N1 is within the allowable delay time period T2; if the normal receptions continue in series (i.e., the predetermined number of times the second microcomputer 20 receives the first pulse count numbers N1 is a second predetermined number more than one), the determination at S140 is affirmed as YES. It is noted that in the present embodiment, the second predetermined number of times of normal receptions is a second number not less than two (i.e., two times or more), and may be identical to or different from the first number at S100. When determining that the second microcomputer 20 receives the first pulse count numbers N1 in series, the second microcomputer 20 advances to S150. At S150, the second microcomputer 20 clears the communication anomaly flag (set in an OFF state), then advancing to S160; the communication anomaly flag indicates an existence of a significant communication anomaly. When not determining that the second microcomputer 20 receives the first pulse count numbers N1 in series, the second microcomputer 20 advances directly to S160 while bypassing S150. The communication anomaly flag is provided to be set (in an ON state) when it is determined that the value of the error counter 25 counting communication anomalies is equal to or greater than a predetermined value; the communication anomaly flag is set at S270, which will be explained later. Therefore, when the value of the error counter 25 is smaller than a predetermined value, the communication anomaly flag is constantly maintained to be reset (i.e., in an OFF state).

At S160, the second microcomputer 20 calculates a determination value, which is the sum of (i) the first pulse count number N1 transmitted from the first microcomputer 10 and (ii) the largest integer not greater than the quotient of T2/T1 (T2: the allowable delay time period; T1: the pulse period of the crank signal). The largest integer not greater than the quotient of (allowable delay time period T2/the pulse period T1) is represented as a gauss notation [T2/T1] or floor (T2/T1). Thus, the determination value is indicated as (N1+[T2/T1]).

At S170, the second microcomputer 20 detects the second pulse count number N2 at a determination time point, which comes after elapsing the allowable delay time period T2 since the detection time point (i.e., which is the allowable delay time period T2 later from the detection time point). The detected second pulse count number N2 is compared with the determination value (N1+[T2/T1]). As illustrated in FIG. 2, when the pulse period T1 is longer than the allowable delay time period T2 so that a delay to differentiate the first pulse count number N1 from the second pulse count number N2 does not occur in the communication over a range from the first microcomputer 10 to the second microcomputer 20, [T2/T1] results in 0 (zero) so that the determination value is equal to N1. In this case, the second microcomputer 20 determines that the determination value being equal to N1 is equal to the second pulse count number N2, and determines that the first microcomputer 10 and the second microcomputer 20 synchronize with the crank signal. The processing then moves to S180.

Further, as illustrated in FIG. 3, when the pulse period T1 is shorter than the allowable delay time period T2 so that a delay to differentiate the first pulse count number N1 from the second pulse count number N2 occurs in the communication over a range from the first microcomputer 10 to the second microcomputer 20, [T2/T1] results in an integer equal to or greater than 1 (one). The count number corresponding to the pulse period T1; thus, the communication delay is indicated by the allowable delay time period T2. Therefore, if the delay is converted into a count number, the count number is represented by an integer part of T2/T1, which is mathematically expressed by [T2/T1]. Therefore, the determination value which is obtained by adding [T2/T1] to the first pulse count number N1 becomes equal to the second pulse count number N2. That is, there is a case where the delay to cause a difference between the first pulse count number N1 and the second pulse count number N2 occurs in the communication over a range from the first microcomputer 10 to the second microcomputer 20. Even in such a case, the second microcomputer 20 can determine that the determination value (N1+[T2/T1]) is equal to the second pulse count number N2, and thereby determines that the first microcomputer 10 and the second microcomputer 20 synchronize with the crank signal. After this determination, the second microcomputer 20 advances to S180. In contrast, when determining that the determination value (N1+[T2/T1]) is not equal to the second pulse count number N2, the second microcomputer 20 determines that the second pulse count number N2 is anomalous, or the second counter 22 has an anomaly, then advancing to S190.

At S180, the second microcomputer 20 clears a counter anomaly flag (i.e., set in an OFF state), then ending the present determination process. The counter anomaly flag is provided to indicate that the second counter 22 is anomalous. It is noted that the counter anomaly flag is set (i.e., in an ON state) when it is determined that the determination value (N1+[T2/T1]) is not equal to the second pulse count number N2; the counter anomaly flag is set at S190 below. Therefore, when the determination value (N1+[T2/T1]) is equal to the second pulse count number N2, the counter anomaly flag is constantly maintained to be reset (i.e., in an OFF state).

At S190, the second microcomputer 20 sets the counter anomaly flag, then advancing to S200.

At S200, the second microcomputer 20 notifies the first microcomputer 10 of the counter anomaly, then advancing to S210.

At S210, the second microcomputer 20 amends the value (i.e., the second pulse count number N2) of the second counter 22 to be equal to the determination value (N1+[T2/T1]), then ending the present determination process.

The following explains S220 to S330. With reference to FIG. 4, with an occurrence of a communication anomaly, the second microcomputer 20 may determine that the actual processing time period, which elapsed or was experienced actually from when the detection time point comes to when the first pulse count number N1 is received by the second microcomputer 20, is longer than the allowable delay time period T2. In this case, the second microcomputer 20 determines that the first pulse count number N1 is not received within the allowable delay time period T2, then moving from S100 to S220. At S220, the second microcomputer 20 determines whether the counter anomaly flag or the communication anomaly flag is set (i.e., in an ON state). When at least one of two flags is set, the second microcomputer 20 advances to S230; when neither is set, it advances to S240. In this connection, the counter anomaly flag is set at S190 above-mentioned; the communication anomaly flag is set at S270 mentioned later.

Advancing to S230 signifies an existence of a significant communication anomaly; namely, (1) an excessive communication delay is determined to have occurred at S100, and simultaneously (2) (i) the counter anomaly flag is set at S190 and/or (ii) the communication anomaly flag is set at S270. At S230, the second microcomputer 20 thereby determines that many anomalies occur or exist to thereby increment the error counter 25 by a first setting value that is greater than a second setting value mentioned later, then advancing to S260.

Advancing to S240 signifies no existence of a significant communication anomaly; namely, (1) an excessive communication delay is determined to have occurred at S100, but (2) (i) the counter anomaly flag is not set at S190 and (ii) the communication anomaly flag is not set at S270. At S240, the second microcomputer 20 thereby determines that a few anomalies occur to thereby increment the error counter 25 by the second setting value that is less than the first setting value, then advancing to S250.

At S250, the second microcomputer 20 sets the determination suspension flag (i.e., in an ON state), which may suspend the determination at S170, then advancing to S260. Therefore, when the determination suspension flag is set, it may not be determined whether the first microcomputer 10 and the second microcomputer 20 synchronize with the crank signal (this is not illustrated specifically in FIG. 7). As explained above, clearing the determination suspension flag results from the affirmative determination at S120 of the normal receptions in series of the first pulse count numbers N1 within the allowable delay time period T2.

At S260, the second microcomputer 20 determines whether the error counter 25 indicates a predetermined value or greater. When the error counter indicates the predetermined value or more, the second microcomputer 20 advances to S270; when less than the predetermined value, it ends the present determination process. As explained above, the first setting value by which the error counter 25 is incremented is used in the case of (1) an excessive communication delay being determined to have occurred at S100, and simultaneously (2) (i) the counter anomaly flag is being set at S190 and/or (ii) the communication anomaly flag being set at S270. In contrast, the second setting value by which the error counter is incremented is used in the case of (1) an excessive communication delay being determined to have occurred at S100, but (2) neither (i) the second counter 22 being set at S190 nor (ii) the communication anomaly flag being set at S270. Thus, the first setting value is designated to be larger than the second setting value in the configuration of the present embodiment. Therefore, as compared with a comparative configuration where the first setting value and the second setting value are identical to each other, the present configuration permits the detection of many communication anomalies to increase the value of the error counter 25 shortly and exceed the predetermined value shortly. Therefore, the second microcomputer 20 advances to S270 earlier than in the above-mentioned comparative configuration.

At S270, the second microcomputer 20 sets the communication anomaly flag, then advancing to S280. As explained above, resetting the communication anomaly flag results from the affirmative determination at S140 of the normal receptions in series of the first pulse count numbers N1 within the allowable delay time period T2.

At S280, the second microcomputer 20 transmits a signal, which contains information indicating an occurrence of a significant communication anomaly, to the first microcomputer 10, thereby notifying the first microcomputer 10 of the significant communication anomaly. Then, the second microcomputer 20 advances to S290.

At S290, the second microcomputer 20 increments the reset counter 26 by one, then advancing to S300.

At S300, the second microcomputer 20 decrements the error counter 25 by the predetermined value designated at S260. Thereby, when the value of the error counter 25 is the predetermined value plus one, the value of the error counter is changed into one, for example. Then, the second microcomputer 20 advances to S310.

At S310, the second microcomputer 20 determines whether the reset counter 26 indicates a predetermined value or greater. When the reset counter 26 indicates the predetermined value or greater, the second microcomputer 20 advances to S320; when less than the predetermined value, it ends the present determination process. In this connection, the predetermined value designated at S310 may be identical or not identical to the "predetermined value" designated at S260.

At S320, the second microcomputer 20 transmits a signal, which contains a reset request of the first microcomputer 10, to the first microcomputer 10, so as to permit the first microcomputer 10 to reset the first communication driver 14, then advancing to S330.

At S330, the second microcomputer 20 clears the reset counter 26 and ends the present determination process.

The following will explain an effect of the counter apparatus 100 according to the present embodiment. As explained above, even when the crank rotates rapidly enough to make the pulse period T1 become shorter than the allowable delay time period T2, it can be determined that the first microcomputer 10 and the second microcomputer 20 synchronize with the crank signal. This permits a determination as to whether the first microcomputer 10 and the second microcomputer 20 synchronize with the crank signal, regardless of variation in the processing speed or transmission speed. Therefore, the first microcomputer 10 and second microcomputer 20 may be provided as a low-priced microcomputer with a slow processing speed; the communication network between the first microcomputer 10 and the second microcomputer 20 may be provided not to require a high-speed communication network. The above configuration suppresses the counter apparatus 100 from increasing costs.

Even when the communication delay (i.e., anomaly in communication), which cannot be admitted in the counter apparatus 100, occurs over a range between the first microcomputer 10 and the second microcomputer 20, the above configuration permits the determination as to whether the first microcomputer 10 and the second microcomputer 20 synchronize with the crank signal. In contrast, the second microcomputer 20 determines whether the first pulse count number N1 is received within the allowable delay time period T2 at S100. When it is determined that it is received, the second microcomputer 20 determines whether the first microcomputer 10 and the second microcomputer 20 synchronize with the crank signal. In contrast, when it is not received, it determines that a communication anomaly occurs. This configuration permits not only the determination as to whether the microcomputers 10 and 20 synchronize with the crank signal, but also the determination as to whether an anomaly in communication occurs.

As described above, when receiving the first pulse count number N1 within the allowable delay time period T2, the second microcomputer 20 determines whether the first microcomputer 10 and the second microcomputer 20 synchronize with the crank signal. Therefore, when the first count number N1 is received within the allowable delay time period T2, it is expected that the first microcomputer 10 is normal, and no anomaly in communication occurs. Thus, that determination value is expected to be normal. In this regard, however, if the determination value is not equal to the second pulse count number N2, the second pulse count number N2 is expected to be anomalous.

To that end, the second microcomputer 20 amends the second pulse count number N2 to be equal to the determination value (N1+[T2/T1]) at S210. Thereby, the second pulse count number N2, i.e., the second counter, is amended to be normal.

When determining that an anomaly in communication occurs at S100, the second microcomputer 20 increments the error counter 25 at S230 or S240. At S260, when the error counter 25 is beyond the predetermined value, the communication anomaly flag is determined to be set at S270. This configuration improves robustness against communication anomalies as compared with a comparative configuration to set the communication anomaly flag when incrementing the error counter by one.

When the error counter 25 indicates the predetermined value or greater at S260, the second microcomputer 20 increments the reset counter 26 at S290. When the reset counter 26 is beyond the predetermined value, the first communication driver 14 of the first microcomputer 10 is reset at S320. This configuration improves robustness against communication anomalies as compared with a comparative configuration to reset the first communication driver 14 when incrementing the reset counter by one.

A communication anomaly may cause an alternate switchover between a successful reception and an unsuccessful reception of the first pulse count number N1 within the allowable delay time period 2 by the second microcomputer 20. Suppose a comparative configuration where the determination suspension flag is cleared after or by one affirmative determination by the second microcomputer 20 of receiving the first pulse count number N1 within the allowable delay time period T2. In such a comparative configuration, even though a communication anomaly still takes place, setting and clearing of the determination suspension flag are switched alternately therebetween. Further, suppose a comparative configuration where the communication anomaly flag is cleared by or after one affirmative determination by the second microcomputer 20 of receiving the first pulse count number N1 within the allowable delay time period T2. In such a comparative configuration, even though a communication anomaly still takes place, setting and clearing of the communication anomaly flag are switched alternately therebetween. This increases a time period up to the time when the counter value of each counter reaches a predetermined value and delays the reset of the first communication driver 14.

In contrast, in the present embodiment, the determination suspension flag is cleared after the successive affirmative determinations by the second microcomputer 20 of receiving the first pulse count numbers N1 within the allowable delay time period T2. Further, the communication anomaly flag is cleared after the successive affirmative determinations by the second microcomputer 20 of receiving the first pulse count numbers N1 within the allowable delay time period T2. This suppresses the increase of a time period up to the time when the counter value of each counter reaches a predetermined value to thereby suppress the delay of the reset of the first communication driver 14.

The preferred embodiment of the present disclosure is thus described; however, without being restricted to the embodiment mentioned above, the present disclosure can be variously modified as long as not deviating from the scope thereof.

In the present embodiment, the first microcomputer 10 performs an injection/ignition control; the second microcomputer 20 detects the pre-ignition; and the microcomputers 10 and 20 synchronize with the crank signal. There is no need to be limited thereto. The microcomputers 10 and 20 may have other intended uses as long as they synchronize with the crank signal.

The present embodiment does not specify which of the microcomputers 10 and 20 detects the pulse period T1. However, the detection of the pulse period T1 may be made by the first microcomputer 10 at least. For example, the first microcomputer 10 detects the pulse period T1 and transmits the pulse period T1 continuously to the second microcomputer 20.

The present embodiment explained an example configuration where the determination suspension flag is cleared at S130 after the successive affirmative determinations by the second microcomputer 20 of receiving the first pulse count numbers N1 within the allowable delay time period T2 at S120. There is no need to be limited thereto. Another configuration may be provided where the second microcomputer 20 clears the determination suspension flag at S130 when the number of times of receiving the first pulse count number N1 within the allowable delay time period T2 exceeds a predetermined number within a predetermined time period at S120, for instance.

Further, the present embodiment explained an example configuration where the communication anomaly flag is cleared at S150 after the successive affirmative determinations by the second microcomputer 20 of receiving the first pulse count numbers N1 within the allowable delay time period T2 at S140. There is no need to be limited thereto. Another configuration may be provided where the second microcomputer 20 clears the communication anomaly flag at S150 when the number of times of receiving the first pulse count number N1 within the allowable delay time period T2 exceeds a predetermined number within a predetermined time period at S140, for instance.

This configuration can provide advantageous effects below as compared with the above-mentioned comparative configuration where the determination suspension flag is cleared by one affirmative determination by the second microcomputer 20 of receiving the first pulse count number N1 within the allowable delay time period T2, or the communication anomaly flag is cleared by one affirmative determination by the second microcomputer 20 of receiving the first pulse count number N1 within the allowable delay time period T2. That is, the provided advantageous effects are suppressing the increase of a time period up to the time when the counter value of each counter reaches a predetermined value to thereby suppress the delay of the reset of the first communication driver 14.

The present embodiment explained an example configuration which uses a determination suspension flag to suspend a determination at S170. In contrast, the determination suspension flag may be used for examine the communication anomaly.

The present embodiment explained an example configuration where the second microcomputer 20 increments the error counter 25 by the first setting value which is greater than the second setting value at S230. However, the first setting value may be designated to be identical to the second setting value.

The present embodiment explained an example configuration where the time when detecting a missing gear tooth is regarded as a detection time point, i.e., the first microcomputer 10 and the second microcomputer 20 determine that a detection time point comes when detecting a missing gear tooth (S20, S60). The first pulse count number N1 standing or effective at the detection time point is transmitted to the second microcomputer 20 (S20, S30). However, there is no need to be limited thereto. The detection time point may be differently defined as an external trigger signal to permit the first microcomputer 10 and the second microcomputer 20 to synchronize with each other.

The present embodiment explained an example configuration where when the missing gear tooth is detected, the counters 12 and 22 clear the respective pulse count numbers (i.e., counted numbers) and then re-start to count a rising edge. However, there is no need to be limited thereto. The counters 12 and 22 may count repeatedly the rising edges from 0 (zero) to 23 based on an external trigger signal to permit the first microcomputer 10 and the second microcomputer 20 to synchronize with each other, instead of re-starting of counting when the missing gear tooth is detected.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A counter apparatus that receives a crank signal with a signal level reciprocating between a high level and a low level to indicate a pulse that takes place each time a crank rotates by a predetermined angle,
the counter apparatus comprising:
a first microcomputer receiving the crank signal; and
a second microcomputer receiving the crank signal, the second microcomputer being electrically connected with the first microcomputer,
the first microcomputer detecting a first pulse count number at a detection time point and transmitting the first pulse count number to the second microcomputer,
the first pulse count number being the number of pulses included in the crank signal received by the first microcomputer,
the second microcomputer detecting a second pulse count number at a determination time point,
the second pulse count number being the number of pulses included in the crank signal received by the second microcomputer,
the determination time point being later since the detection time point by a time period equal to or greater than a processing time period that is expected to elapse from the detection time point to when the first pulse count number is received by the second microcomputer,
the second microcomputer determining whether the crank signal received by the first microcomputer is equal to the crank signal received by the second microcomputer by comparing the second pulse count number with a determination value that is the sum of (i) the first pulse count number and (ii) the largest integer not greater than the quotient of T2/T1, T1 being a pulse period of the crank signal, T2 being an allowable delay time period that ranges from the detection time point to the determination time point.

2. The counter apparatus according to claim 1, wherein:
the second microcomputer calculates an actual processing time period, the actual processing time period being actually experienced from the detection time period to when the first pulse count number is received by the second microcomputer;
when the actual processing time period is not greater than the allowable delay time period, the second microcomputer determines whether the crank signal received by the first microcomputer is equal to the crank signal received by the second microcomputer by comparing the second pulse count number with the determination value; and
when the actual processing time period is greater than the allowable delay time period, the second microcomputer determines whether a communication anomaly occurs over a range between the first microcomputer and the second microcomputer.

3. The counter apparatus according to claim 2, wherein:
when the determination value is not equal to the second pulse count number, the second microcomputer determines that the second pulse count number is anomalous;
when the second microcomputer determines that the second pulse count number is anomalous, the second pulse count number is amended to be equal to the determination value.

4. The counter apparatus according to claim 2, wherein:
when the second microcomputer determines that the communication anomaly occurs over the range between the first microcomputer and the second microcomputer, the second microcomputer increments a count of an error counter; and
when the count of the error counter is equal to or greater than a predetermined value, the second microcomputer determines an existence of a significant communication anomaly.

5. The counter apparatus according to claim 4, wherein:
when the count of the error counter is equal to or greater than a predetermined value, the second microcomputer increments a count of a reset counter; and
when the count of the reset counter is equal to or greater than a predetermined value, the second microcomputer transmits a reset request to the first microcomputer.

6. The counter apparatus according to claim 4, wherein:
when the second microcomputer determines that the communication anomaly occurs over the range between the first microcomputer and the second microcomputer, the second microcomputer sets a determination suspension flag, which suspends the determining whether the crank signal received by the first microcomputer is equal to the crank signal received by the second microcomputer; and
the second microcomputer resets the determination suspension flag when normal reception cases occur in series, the normal reception case being a case where the actual processing time period is not greater than the allowable delay time period.

7. The counter apparatus according to claim 4, wherein:
when the second microcomputer determines the existence of the significant communication anomaly, the second microcomputer sets a communication anomaly flag that indicates the existence of the significant communication anomaly; and
the second microcomputer resets the communication anomaly flag when normal reception cases occur in series, the normal reception case being a case where the actual processing time period is not greater than the allowable delay time period.

8. The counter apparatus according to claim 1, wherein:
the second microcomputer gives a priority order to each of a plurality of processing of signals that are inputted;
the first microcomputer has a function of retransmission in cases where a reception of a signal, which was transmitted to the second microcomputer, is not successful; and
the second microcomputer designates the determination time point based on the priority order and the retransmission.

* * * * *